United States Patent
Klink et al.

[11] Patent Number: 5,956,563
[45] Date of Patent: *Sep. 21, 1999

[54] METHOD FOR REDUCING A TRANSIENT THERMAL MISMATCH

[75] Inventors: Erich Klink, Schönaich; Dietmar Schmunkamp, Ehningen; Helmut Weber, Dettenhausen; Roland Frech, Ostfildern; Bernd Garben, Schönaich; Hubert Harrer, Böblingen, all of Germany

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/765,525
[22] PCT Filed: Jun. 6, 1995
[86] PCT No.: PCT/EP95/02152
  § 371 Date: Jan. 9, 1997
  § 102(e) Date: Jan. 9, 1997
[87] PCT Pub. No.: WO96/39714
  PCT Pub. Date: Dec. 12, 1996
[51] Int. Cl.$^6$ .................................................. H01L 21/00
[52] U.S. Cl. ................................. 438/5; 438/15; 438/455; 438/456; 438/457; 438/458; 438/459; 438/612; 324/765; 324/766; 324/767; 324/768; 324/769; 713/300; 713/501
[58] Field of Search .................... 438/5, 15, 455–459, 438/612; 324/765–769; 713/300, 501

[56] References Cited

U.S. PATENT DOCUMENTS

| | | | |
|---|---|---|---|
| 5,278,457 | 1/1994 | Fujita et al. | 307/269 |
| 5,407,863 | 4/1995 | Katsura et al. | 437/197 |
| 5,490,059 | 2/1996 | Mahalingaiah et al. | 364/166 |
| 5,498,971 | 3/1996 | Turnbull et al. | 324/760 |
| 5,502,838 | 3/1996 | Kikinis | 395/550 |
| 5,664,201 | 9/1997 | Ikedea | 395/750.03 |
| 5,713,030 | 1/1998 | Evoy | 395/750 |

OTHER PUBLICATIONS

IBM Technical Bulletin, vol. 31, No. 8, Jan. 1989, New York USA, pp. 349–350, 'Method of Controlling Transient Temperature Differential of Integrated Circuits and Substrates'.

*Primary Examiner*—John F. Niebling
*Assistant Examiner*—David A. Zarneke
*Attorney, Agent, or Firm*—Marc A. Ehrlich

[57] ABSTRACT

The invention relates to a method for reducing a transient thermal mismatch between a first component and a second component which are in mechanical contact with one another. The temperature of the first component is controlled by the amount of energy dissipated thereby. The amount of energy dissipated is controlled as a function of a data pattern input into the first component which causes a certain number of gates within the component to switch per clock cycle. By determining the desired energy dissipation in terms of the number of gates which are to be switched and arranging the input data pattern accordingly, the thermal mismatch between the components may be reduced.

10 Claims, 2 Drawing Sheets

STATE OF THE ART a) STRAIN AMPLITUDE FOR INSTANTANEOUS POWER ON
b) STRAIN AMPLITUDE FOR CONTROLLED POWER ON

METHOD FOR REDUCING A TRANSIENT THERMAL MISMATCH

The invention relates to a method for reducing a transient thermal mismatch between a first component and a second component which are mechanically in contact.

It is known from the prior art that mismatches in coefficients of thermal expansion of two components which are in contact with each other causes mechanical strain which can lead to the failure of the connection between the components. In particular surface mounted devices often show solder joint cracking due to mismatches in coefficients of thermal expansion between the card, the lead, the chip and the packaging mould compound. It is proposed in U.S. Pat. No. 5,367,124 to minimize this problem by reducing the cross sectional area of that portion of the lead subject to greatest movement due to thermal cycling. Thereby also the problem of solder joint cracking is helped.

Another approach is described in U.S. Pat. No. 4,764,848 where an electronic module or substrate is mounted to the surface of a printed circuit board by means of a plurality of bend or deformed pins. The bend pin design provides 3-dimensional strain relief of former stresses and/or mechanical stresses due to flexure and torque.

From IBM Technical Disclosure Bulletin, Vol. 37, No. 4B, April 1994, pp. 137–140 a solder ball connect design with improved reliability is known. Because the coefficients of thermal expansion mismatch between the module and card, the solder ball joints experience strain during power cycling of the device. Some themal strain is also present due to bending of the module-card assembly again due to the thermal expansion mismatch. To address this problem the proposed design uses corner pins instead of balls, which are soldered into through-holes in the card. This results an improved reliability of all of the solder connections in the array.

Other approaches to address this problem are known from IBM Technical Disclosure Bulletin, Vol. 36, No. 7, July 1993, pp. 199–200, "Method of Reducing Thermal Stress on Ceramic Substrate of Thermal Conduction Module", IBM Technical Disclosure Bulletin, No. 5, October 1991, pp. 466–467, "Relief of Residual Stress in Solder Fillet", IBM Reserch Disclosure, No. 322, February 1991, "Flex Interconnect between Transistor/Diode Leads and Ceramic Substrate" and IBM Reserch Disclosure, No. 309, January 1990, "Solder Joint Life Improvement Using Adhesive under Component".

Furthermore, the thermal mismatch problem is also addressed in the following IBM Technical Disclosure Bulletins:

TDB, No. 2, July 1990, pp. 253–254, "Thermal Fatigue-Resistant Joint for I/C Packaging Applications"; TDB, September 1989, pp. 436–437, "Decal With Power/Ground Plane Partitioned by Thermal Coefficient of Expansion"; TDB, September 1989, pp. 7–8, "Stress Reliever for Single In-Line Package (Sip) Solder Joints"; TDB, September 1989, pp. 365–366, "Strain Relief and Card Retention for Duplex Fiber-Optic Packaging"; TDB, January 1989, pp. 135–138, "Thin Film Module"; TDB, April 1987, pp. 4736–4737, "Area Array Substrate-To-Carrier Interconnection Using Corner Standoff"; TDB, September 1982, p. 1843, "I/O Lead Isolation to Prevent Solder Joint Fatigue"; TDB, August 1979, p. 950, "Circuit Package With Improved Fatigue Life"; TDB, February 1972, pp. 2595–2596, "Balance Straining Package"; TDB, April 1969, p. 1559, "Composite Structures for Modifying Thermal Coefficient of Expansion".

U.S. Pat. No. 4,764,848 contemplates the problem when array substrates are mounted directly to printed circuit boards. The substrates themselves tend to be relatively rigid and inflexible, but the thermal coefficients of expansion differ between the material of which a printed circuit board is comprised and a second material of which a substrate to be mounted is comprised, causing a strain therebetween. As an example when subjected to changes of temperature, an epoxy printed circuit board tends to expand at as much as five times the rate of ceramic that is used to form a substrate. This prior art teaching proposes to solve this problem by a surface mounted array strain relief device comprising an electrical conductor having at least two bends for providing strain relief.

Another approach to address the problem of solder joint cracking due to thermal cycle stress is proposed in U.S. Pat. No. 5,367,124. A compliant lead which extends from the package and includes at least two regions of different lead thickness is proposed.

The proposals of the prior art to help the thermal strain problem and to improve the life-time of C4 solder interconnections between silicon and ceramic comprise thermal enhancements such as special heat sinks and thermal pastes between the chip backside and cap/heatsink to reduce the chip temperature. This approach is disadvantageous in terms of costs and process complexity.

C4-ball epoxy encapsulants are also often used. However, they have the disadvantage that the modules are not reworkable, which implies that no chip replacement is possible. Also, the usage of glass ceramic substrates has been proposed. The thermal coefficient of expansion of this material is closer to that of silicon, however the costs of the substrate manufacturing process are much higher. Alternatively solder connect materials as e.g. PbIn have the disadvantages of corrosion. Double stack solder connections are much more complex and more expensive.

Therefore the underlying problem of the invention is to provide a method to improve the reliability of the mechanical and/or electrical connection of two components. The problem of the invention is solved by the features set forth in claim 1.

The invention is particularly beneficial for electronic packages consisting of different materials as e.g. Silicon chips on ceramic substrates. The silicon and the ceramic material expand and contract at different rates in response to heating and cooling, respectively, due to their different coefficients of thermal expansion. Repeated heating and cooling of packages with chips (power on/off cycles) can cause flexure of the solder interconnections between the silicon chips and ceramic substrates. This effect, called thermal fatigue which reduces the life time of such a package significantly, is addressed by the present invention.

The present invention can advantageously be used for silicon components, such as integrated circuit chips, which are mechanically connected to a packaging component, such as a multilayer ceramic module. Complex substrates, such as multilayer ceramic modules have a high heat capacity due to the large number of ceramic layers. Therefore such modules heat up and cool down much slower than the silicon chip which is packaged by the module. When the power of the chip is switched on abruptly, the thermal mismatch and strain between the chip and the module can change the sign as a result of the high heat capacity of the module. This causes opposite shear forces in the C4 solder ball connections between the chip and the module and cause a significant increase in strain amplitude.

According to the teaching of the invention the power of the chip is not switched on or off abruptly but is gradually increased or decreased as the case might be. Thereby the temperature of the integrated circuit chip component is controlled, so that the temperature difference between the integrated circuit chip component and the module does not exceed a certain predefined maximum value. This implies, also that the transient thermal mismatch strain does not exceed such a predefined maximum.

Furthermore, the amplitude of the transient mechanical stress due to the thermal mismatch is significantly reduced by the teaching of the invention. This is of utmost importance for the life time improvement of the package. Since the thermal mismatch during the cool down phase can be even larger than during power up, the invention is also beneficial during the power down phase.

One way of carrying out the invention is described in detail below with reference to the drawing in which:

FIG. 2 is a diagram showing the increase of chip temperature over time for instantaneous and controlled power on.

FIG. 3 is a diagram showing the development of the mechanical strain occurring at the C4-ball interconnections between the chip and the module during power on.

Figure 4:
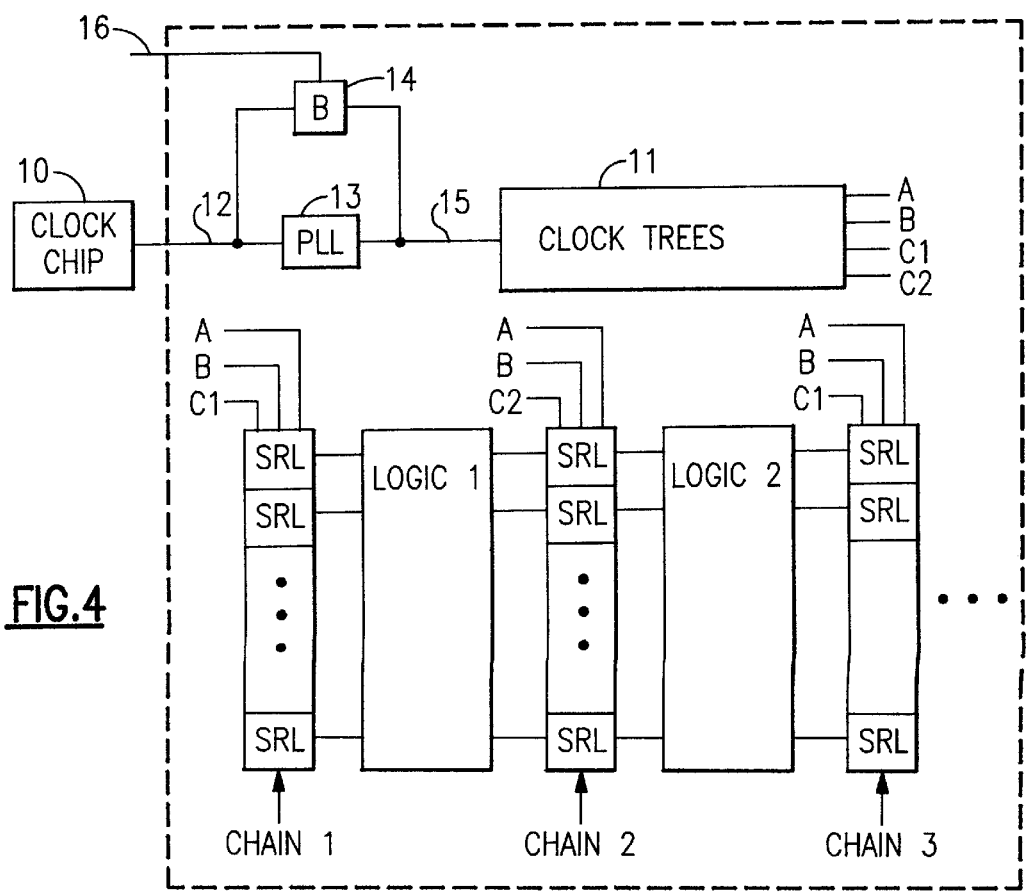

FIG. 4 schematically shows the internal working of the chip 2.

The lifetime N (in cycles) of solder interconnections between the silicon chip and the ceramic substrate is approximately defined by the Coffin-Manson equation (cf. R. R. Tummala, E. J. Rymaszewski, "Microelectronics Packaging Handbook", New York 1988, p. 295). Neglecting the elastic strain, the lifetime N is defined as:

$$N = \left(\frac{A}{\epsilon}\right)^2$$

Figure 1:
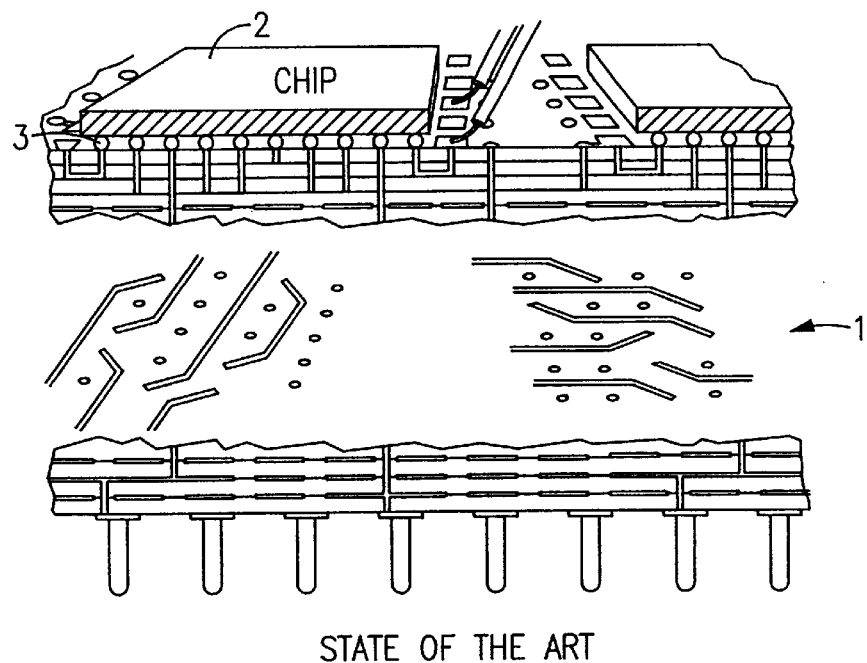
FIG. 1 is a simplified cross sectional view of a state of the art multilayer ceramics module which packages chips.

A=material constant
$\epsilon = (B \cdot l(\alpha_C \cdot \Delta T_C - (\alpha_{si} \cdot \Delta T_{si})))$
$\epsilon$=plastic strain amplitude
B=geometry constant
l=distance from chip neutral point to interconnection
$\alpha_{si}$=2.8·10$^{-6}$ K$^{-1}$ coefficient of thermal expansion of silicon
$\alpha_C$=6.5·10$^{-6}$ K$^{-1}$ coefficient of expansion of ceramic substrates Al$_2$O$_3$
$\Delta T_{si}$, $\Delta T_C$=temperature excursions during cycle
$\alpha_C \times \Delta T_C - \alpha_{si} \times \Delta T_{si}$ . . . thermal mismatch Table 1 shows an example for the thermal mismatch between a silicon chip and an aluminum oxide ceramic substrate for instantaneous power on. Such a module 1 is shown in FIG. 1. Chips 2 are connected via C4-balls 3 to the module 1. The temperature difference experienced by the chip 2 during power on is 60° C. whereas the temperature difference experienced by the module 1 is 57° C. This results in a thermal mismatch for the steady state as indicated in the first column of table 1. Since the heat capacity of the chip 2 is much lesser than the heat capacity of the module 1 it is a reasonable approximation to assume that the chip 2 immediately heats up to the steady state temperature at power on, whereas it takes some time for the module 1 to heat up to this temperature. If one assumes, that the module 1 heated up by 2° C. when the chip 2 already reached the steady state temperature this results in the negative thermal mismatch as indicated in the second column of table 1. It appears that the transient thermal mismatch has a negative sign whereas the thermal mismatch in the steady state has a positive sign. As a consequence, the amplitude of the change of the thermal mismatch during heat up is much greater than the thermal mismatch in the steady state.

TABLE 1

|  | steady state | transient heat up |
|---|---|---|
| $\Delta T_{Si}$ | 60° C. | 60° C. |
| $\Delta T_C$ | 56° C. | 2° C. |
| thermal mismatch | 2.0 × 10 − 4 | −0.95 × 10 − 4 |

Figure 2:
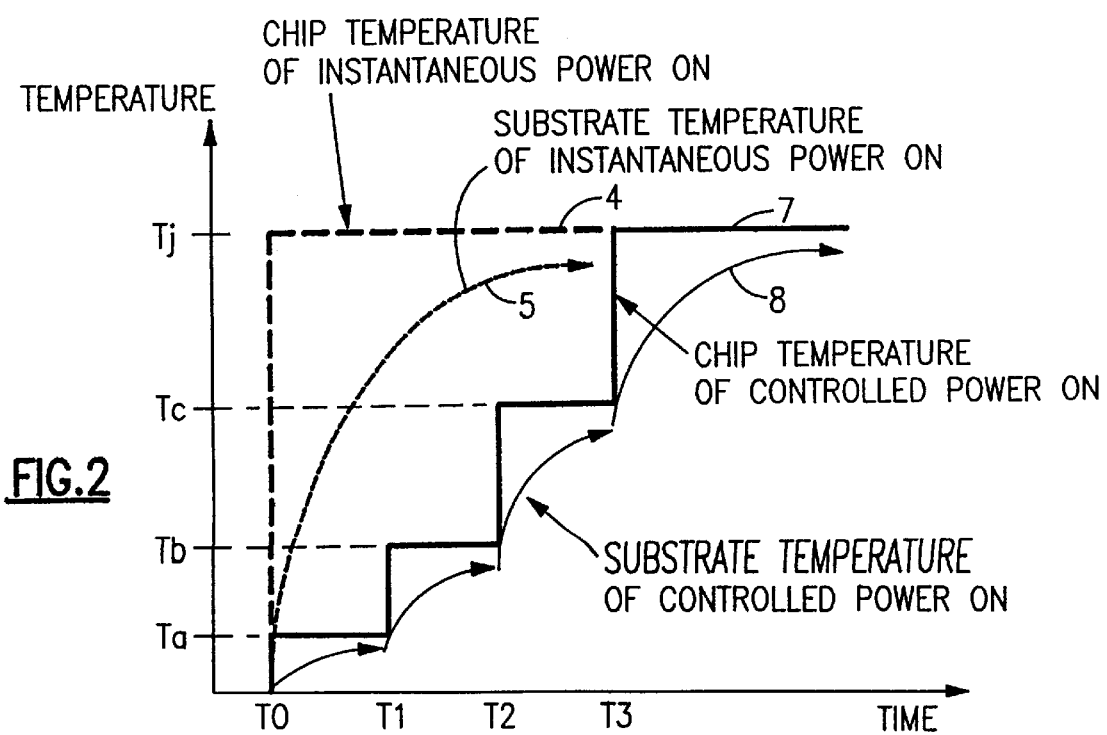

This is also illustrated in FIG. 2. The dashed line 4 in FIG. 2 shows that the temperature of the chip 2 jumps to the steady state temperature T$_j$ at time T0. Since the module 1 has a much greater heat capacity than the chip 2, the temperature of the module 1 increases at a much slower rate. This is illustrated by the dashed line 5 in FIG. 2. The corresponding strain curve 6 in FIG. 3 which is also drawn in dashed lines shows the resulting strain forces occurring between the module 1 and the chip 2 over time. The distance a) indicates the strain amplitude for the case of instantaneous power on considered here.

Figure 3:
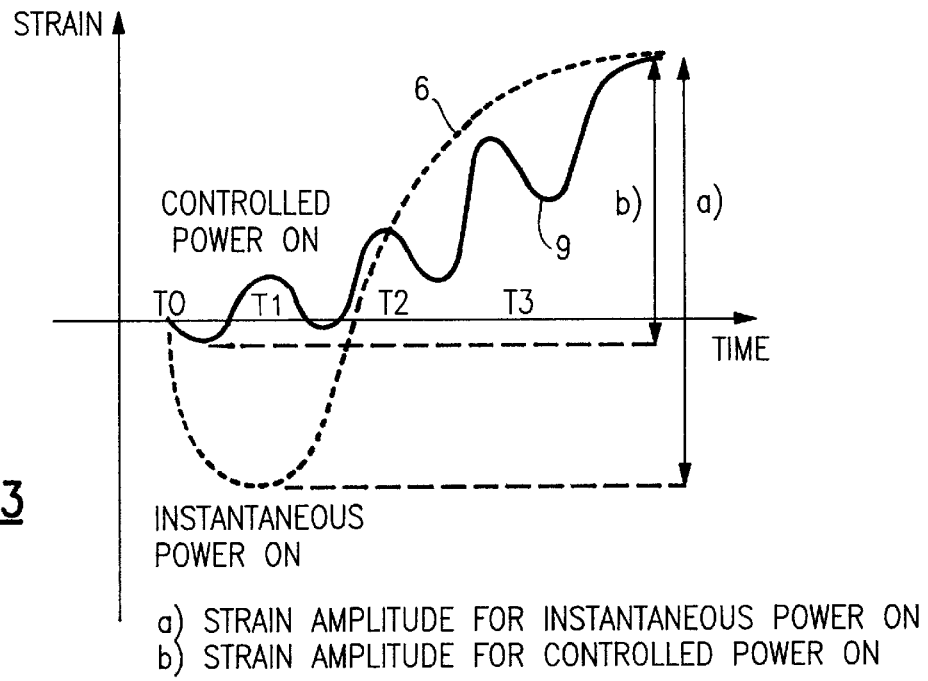

The invention aims to reduce the transient strain amplitude a) as shown in FIG. 3. In order to increase the package lifetime the chip 2 is gradually heated up and cooled down during operation cycles (On/Off). Thereby the transient temperature difference between chip and substrate and the maximum negative thermal mismatch and strain are reduced. The steady state thermal mismatch is not changed.

In the example shown in FIG. 2 the temperature of the chip 2 is controlled to gradually increase in a stepwise manner. This is illustrated by the curve 7 in FIG. 2. At the time T0 the temperature of the chip 2 is increased to Ta at the time T1 the temperature is increased to Tb, at the time T2 the temperature is increased to Tc and at the time T3 the temperature is increased to the steady state temperature Tj. In the time intervals between T0 and T1, T1 and T2, T2 and T3 and from T3 onwards the temperature of the module 1 increases towards the corresponding temperature Ta, Tb, Tc and Tj, respectively, of the chip 2. This is illustrated by the curve 8 of FIG. 2 which shows the development of the temperature of module 2 over time.

The gradual stepwise increase of the temperature of the chip 2 results in the strain curve 9 of FIG. 3. The strain curve 9 illustrates the development of the mechanical strain between the chip 2 and the module 1 over time because of the transient thermal mismatch. The curve 9 for the case of controlled power on considered here corresponds to the curve 6 for instantaneous power on.

FIG. 3 also shows the strain amplitude b) for controlled power on. Because of the gradual increase of the chip temperature according to the invention the strain amplitude b) is much smaller than the strain amplitude a) for instantaneous power on. This is because the large negative strain at the beginning of the power on phase is minimized due to the relatively small increase in the temperature of the chip 2 at the beginning of the power on phase.

Since the coefficient of expansion of the ceramic substrates of the module 1 is much bigger than the corresponding coefficient of the silicon of chip 2 it is important that the first increase of the chip temperature to temperature Ta is relatively small in order to prevent a negative transient strain. Later on, when the module 1 has already considerably heated up, the following temperature steps can progressively increase. This is because due to the larger coefficient of expansion of the ceramic substrate the strain remains positive even though the chip temperature is further increased because the module 1 already expanded much more than the chip 2 due to the differences of the coefficients of thermal expansion.

This is also the case in the example considered here. The smallest increase of chip temperature is experienced when at the time T0 the chip 2 is controlled to heat up to the temperature Ta. The further increments from temperatures Ta to Tb, from Tb to Tc and in the end from Tc to Tj progressively increase. This is beneficial because thereby the time required for the controlled power on is significantly reduced as compared to a controlled power on procedure when the increment of the chip temperatures between the times T0, T1, T2, T3 is limited to the initial temperature increase experienced by the chip 2 at the time T0.

Column 1 of table 2 shows the transient thermal mismatch amplitude at the time T0. At the time T0 it is reasonable to assume that the chip temperature instantaneously jumps to the temperature Ta. This corresponds to a temperature increase of 9° C. of the silicon of chip 2. However, at the time T0 the temperature of the ceramics module has not yet changed, i. e. $\Delta T^T = 0°$ C. This results in the transient thermal mismatch as indicated in the first column of table 2.

TABLE 2

|  | transient heat up start | transient heat up end |
|---|---|---|
| $\Delta T_{Si}$ | 9° C. | 60° C. |
| $\Delta T_C$ | 0° C. | 51° C. |
| thermal mismatch | $-0.25 \times 10 - 4$ | $1.6 \times 10 - 4$ |

As a result as significant increase in the lifetime is obtained as described by the following estimate:

$\epsilon_i$=plastic strain amplitude for instantaneous power on
$\epsilon_C$=plastic strain amplitude for controlled power on The ratio ($\epsilon_i/\epsilon_C$) is estimated based on the results given in tables 1 and 2 as follows:

$$\frac{\epsilon_i}{\epsilon_c} = \frac{2 \times 10^{-4} + 0.95 \times 10^{-4}}{2 \times 10^{-4} + 0.25 \times 10^{-4}} = 1.3$$

$$>>> > \frac{N_C}{N_i} = (1.3)^2 = 1.7$$

where $N_C$ is the lifetime for controlled power on and where $N_i$ is the lifetime for instantaneous power on. Since the ratio in this example of $N_C$ and $N_i$ is 1.7 the lifetime of the package is improved by 70% due to the method according to the invention.

The control of the temperature of the first component—in this case chip 2—can be accomplished by gradually changing the power supply voltage applied to the chip. This is because the dissipated energy of the chip 2 is proportional to the square of the voltage applied to the chip 2. The dissipated energy heats up the chip 2. This means that by controlling the amount of dissipated energy per time of the chip 2 the temperature of the chip 2 is also controlled.

In the following it is assumed that the transient thermal mismatch between the chip 2 and the module 1 is to be reduced during power on of the computer system which incorporates the module 1. As already pointed out above one way of controlling the temperature rise during power on of the chip 2 is to gradually—for example step wise—increase the power supply voltage applied to the chip 2.

If the chip 2 is a clocked electronic component, the dissipated energy and thus the temperature can be controlled by the clock frequency applied to the chip 2. This is because the switching operations in the chip 2 which take place in response to a pulse of the clock applied to the chip 2 result in a certain amount of dissipated energy. The overall dissipated energy of the chip 2 is proportional to the frequency of the clock pulse. Hence, another way to control the temperature rise during power on is to gradually—for example stepwise—increase the frequency of the clock pulse applied to the chip 2.

If the chip 2 is a logic chip, such as a microprocessor, it is also possible to control the temperature of the chip 2 by a special data pattern which is inputted into the chip 2 during power on: If one would apply a constant data pattern as an input signal to the chip 2 and if this data pattern would not change over time, this would imply that no switching operations of the logic gates or shift register latches (SRLs) in the chip 2 would take place. As a consequence the logic gates of the chip 2 would in this case not contribute to the dissipated energy of the chip 2.

However, if the input data pattern would change from one clock pulse to another this results in switching operations of the logic gates of chip 2 and thus in dissipation of energy. The more logic gates that switch in response to the input data pattern, the more energy is dissipated per clock pulse. The dissipated energy reaches a maximum if the input data pattern is chosen to change from one clock pulse to another so that a maximum number of logic gates switch in response thereto. This is the case—for example—if every bit of the input data pattern changes its state from one clock pulse to another, i. e. from logically 0 to logically 1 or vice versa.

In order to gradually increase the amount of energy dissipated per clock pulse during power on an input data pattern is applied to the chip 2 which results in a gradual increase of the number of logic gates or SRLs switching. At the beginning of the power on operation a data pattern is applied which results in only a few switches of logic gates or SRLs. After the module 1 slightly heated has up, the data pattern is changed to slightly increase the number of logic gates or SRLs switching per clock pulse so that temperature of the chip 2 is further increased. Thereby the temperature of the chip 2 is gradually increased for example according to the curve 7 shown in FIG. 2.

It is also possible to combine the voltage ramping, the clocking of the chip and the special data pattern to control the temperature of the chip 2. This is clarified by reference to FIG. 4.

FIG. 4 schematically shows the internal working of the chip 2. The chip 2 comprises a plurality of logic blocks. These logic blocks consist of a plurality of combinational logic gates. Only the logic blocks logic 1 and logic 2 are shown in FIG. 4. The logic blocks are separated by chains of shift register latches SRLs. Only the SRL chain 1, chain 2 and chain 3 are shown in FIG. 4. This architecture is known from the prior art as level sensitive scan design (LSSD) boundary scan architecture. This architecture is described for example in "The Design of a Microprocessor", Wilhelm G. Spruth, Springerverlag, Heidelberg 1989, Chapter 5.1.5, and in the U.S. Pat. No. 3,783,254 and U.S. Pat. No. 4,875,003. This prior art is incorporated herein by reference.

The chains of shift register latches have master and slave clocks connected thereto, i. e. A-clock, $C_1$-clock and $C_2$-clock. These out-off-phase clock pulses are provided to the chains of shift register latches via a clock distribution network 11, in this case by a clock tree. The clock tree can be a so called H-tree. Other types of clock trees are known for example from IBM Technical Disclosure Bulltein, Vol. 38, No. 2, February 1995, pp. 109–110, TDB, Vol. 37, No.

10, October 1994, pp. 333–334, TDB, No. 8, January 1992, pp. 233–240, TDB, No. 8, January 1991, pp. 288–291, TDB, No. 8A, January 1990, pp. 17–20, TDB, September 1987, pp. 1453–1454 and TDB, December 1983, pp. 3510–3514.

It is to be noted that each of the clock signals A, $C_1$, $C_2$ have their own clock tree. A clock tree comprises a buffer circuit at each of its nodes in order to amplify the clock signal. The clock signals originate from a clock chip 10 which comprises an oscillator. The output signal of the clock chip 10 is applied via line 12 to the phase locked loop PLL 13. The output of the PLL 13 is applied via line 15 to the clock tree 11. The PLL 13 doubles the frequency of the clock signal on line 12. The PLL 13 is bypassed in response to a corresponding signal applied at the input 16 of a bypass B14. In order to gradually increase the temperature of the chip 2 no master clocks are active ($C_1$ and $C_2$-clocks) during a first phase of the power on procedure. As a consequence the data path are not active and no switching of logic gates in the logic blocks of the chip 2 occurs. However the B-clock is switched on. Since the clock tree of the B-clock comprises buffers this results in the dissipation of energy, since each of the buffers switches with each clock pulse. The PLL 13 is bypassed by the bypass 14 so that the frequency of the B-clock is only half the normal operational frequency. As a consequence the dissipated energy of chip 2 is only about 10% of the energy which is dissipated under normal operational conditions. This phase of the power-on takes about 2 minutes.

Subsequently, the PLL 13 is activated since the signal at the input 16 of the bypass B 14 is no longer applied. This doubles the frequency of the B-clock. Still there are no master clocks $C_1$ and $C_2$ running so that still no data paths are active. The chip 2 is operated in the scan pattern-shift mode. The amount of energy which is dissipated by each shift operation can be controlled by the data pattern which is shifted in the chains. A data pattern consisting of a sequence of identical data such as 00000 . . . or 11111 . . . would not result in a significant amount of energy dissipation because no switching operations take place in the SRLs. However, if every SRL of the chain switches with every clock pulse of the B-clock this will result in a maximum amount of dissipated energy. This is the case for a data pattern having a maximum number of chains from 1 data to the other, for example 01010101 . . .

If a data pattern such as 000111000111 . . . is applied to the SRL chain this will results in an amount of dissipated energy which is in between of the extreme cases considered above. Such a data pattern results in about 30% of the normal power dissipation of the chip 2. Hence, it is possible by varying the scan pattern to control the warmup of the chip 2, for example according to the curve 7 of FIG. 2.

In addition to the above described cycle time variation and variations of the scan pattern in the shift mode, also voltage ramping can be applied. Furthermore, it is also possible as already pointed out above to operate the chip 2 in an operational mode where the master clocks are running to achieve the controlled heat up of the chip 2. Again, in this case the control is accomplished by the input data pattern applied to the logic blocks since the input data pattern correspond to the number of switching operations in the logic blocks and hence to the power dissipation of the chip 2.

We claim:

1. A method for reducing a transient thermal mismatch between a first component and a second component, the temperature of the first component being controllable, wherein said first component is a clocked logic integrated circuit having a plurality of coupled logic gates therein, said coupled logic gates including a means for sequentially receiving a pattern of input data and a means for switching the logical states thereof responsive to said pattern of input data, said switching of said logical gates dissipating an amount of energy, and wherein said first and second components are mechanically in contact, said method comprising the steps of:

determining a number of said logic gates which are to switch per clock cycle; and inputting a data pattern including a string of ones and zeros into the first component, said input data pattern being arranged to cause said determined number of said logic gates in said first component to switch per clock cycle, said switching of said determined number of said logic gates serving to gradually change the temperature of the first component.

2. A method according to claim 1 further comprising the step of:

inputting a second data pattern, said second data pattern arranged to cause a second number of said logic gates in said first component to switch per clock cycle wherein said second number is different from said determined number.

3. A method according to claim 1 wherein said logic gates include a chain of shift register latches and wherein said input data pattern is shifted sequentially through the chain.

4. A method according to claim 1 wherein said temperature of said first component is controlled so that said transient thermal mismatch between said first component and said second component does not exceed a predefined maximum value.

5. A method according to claim 1 wherein the first component is controlled to provide a stepwise change of the temperature thereof over time.

6. A method according to claim 5 wherein the steps of said stepwise change includes increasing temperature increments over time.

7. A method according to claim 1 wherein the temperature of the first component is controlled to provide a positive mechanical strain between said first component and said second component for the duration of the transient thermal mismatch.

8. A method according to claim 1 further comprising the step of controlling the voltage or input current of said first component to gradually change the temperature thereof.

9. A method according to claim 1 further comprising the step of changing the frequency of a clock of the first component to gradually change the temperature thereof.

10. A method according to claim 1 wherein said second component is a packaging structure.

* * * * *